(12) United States Patent
Wu et al.

(10) Patent No.: US 10,872,862 B2
(45) Date of Patent: Dec. 22, 2020

(54) PACKAGE STRUCTURE HAVING BRIDGE STRUCTURE FOR CONNECTION BETWEEN SEMICONDUCTOR DIES AND METHOD OF FABRICATING THE SAME

(71) Applicant: Taiwan Semiconductor Manufacturing Co., Ltd., Hsinchu (TW)

(72) Inventors: Chih-Wei Wu, Yilan County (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/939,288

(22) Filed: Mar. 29, 2018

(65) Prior Publication Data
US 2019/0304913 A1    Oct. 3, 2019

(51) Int. Cl.
*H01L 23/538* (2006.01)
*H01L 25/065* (2006.01)
*H01L 23/31* (2006.01)
*H01L 23/00* (2006.01)
*H01L 25/00* (2006.01)

(52) U.S. Cl.
CPC .......... *H01L 23/5381* (2013.01); *H01L 23/31* (2013.01); *H01L 23/5384* (2013.01); *H01L 24/19* (2013.01); *H01L 24/97* (2013.01); *H01L 25/0657* (2013.01); *H01L 25/50* (2013.01); *H01L 2224/16145* (2013.01)

(58) Field of Classification Search
CPC ........... H01L 2224/97; H01L 2924/181; H01L 2924/15311; H01L 23/5389; H01L 25/50; H01L 2224/73204; H01L 24/19; H01L 21/568; H01L 2224/19; H01L 2224/83005; H01L 25/0657; H01L 24/97; H01L 23/49827
USPC ........ 438/106, 107, 109, 126, 127; 257/737, 257/773, 774, 777, 787, E21.499, 257/E21.502, E23.174
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |

(Continued)

*Primary Examiner* — David Chen
(74) *Attorney, Agent, or Firm* — JCIPRNET

(57) ABSTRACT

A package structure including a first semiconductor die, a second semiconductor die, a molding compound, a bridge structure, through insulator vias, an insulating encapsulant, conductive bumps, a redistribution layer and seed layers is provided. The molding compound encapsulates the first and second semiconductor die. The bridge structure is disposed on the molding compound and electrically connects the first semiconductor die with the second semiconductor die. The insulating encapsulant encapsulates the bridge structure and the through insulator vias. The conductive bumps are electrically connecting the first and second semiconductor dies to the bridge structure and the through insulator vias. The redistribution layer is disposed on the insulating encapsulant and over the bridge structure. The seed layers are respectively disposed in between the through insulator vias and the redistribution layer.

20 Claims, 10 Drawing Sheets

(56) References Cited

U.S. PATENT DOCUMENTS

| | | | |
|---|---|---|---|
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,607,967 B1* | 3/2017 | Shih | H01L 25/0657 |
| 2012/0074585 A1* | 3/2012 | Koo | H01L 21/486 |
| | | | 257/774 |
| 2012/0146209 A1* | 6/2012 | Hu | H01L 23/36 |
| | | | 257/692 |
| 2013/0012015 A1* | 1/2013 | Oh | H01L 24/11 |
| | | | 438/614 |
| 2014/0103527 A1* | 4/2014 | Marimuthu | H01L 23/3128 |
| | | | 257/737 |
| 2015/0084206 A1* | 3/2015 | Lin | H01L 23/5389 |
| | | | 257/774 |
| 2015/0206865 A1* | 7/2015 | Yu | H01L 25/18 |
| | | | 257/737 |
| 2015/0279776 A1* | 10/2015 | Hu | H01L 23/49861 |
| | | | 257/668 |
| 2015/0348916 A1* | 12/2015 | Chen | H01L 21/4803 |
| | | | 257/669 |
| 2016/0118333 A1* | 4/2016 | Lin | H01L 25/16 |
| | | | 257/773 |
| 2016/0276307 A1* | 9/2016 | Lin | H01L 23/552 |
| 2016/0365324 A1* | 12/2016 | Kim | H01L 24/32 |
| 2019/0181092 A1* | 6/2019 | Hsiung | H01L 21/76829 |

* cited by examiner

PACKAGE STRUCTURE HAVING BRIDGE STRUCTURE FOR CONNECTION BETWEEN SEMICONDUCTOR DIES AND METHOD OF FABRICATING THE SAME

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
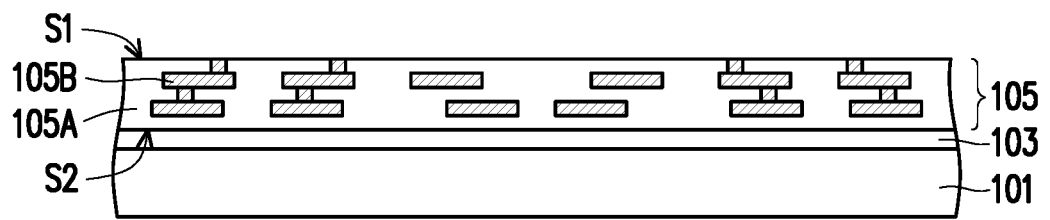
FIG. 1A to FIG. 1H are schematic sectional views of various stages in a method of fabricating a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic sectional views of various stages in a method of fabricating a package structure according to some exemplary embodiments of the present disclosure. As shown in FIG. 1A, a carrier 101 with a de-bonding layer 103 coated thereon is provided. The carrier 101 may be a glass carrier or any suitable carrier for carrying a semiconductor wafer or a reconstituted wafer used for the method of fabricating the package structure. In some embodiments, the de-bonding layer 103 may be a light-to-heat conversion (LTHC) release layer. In certain embodiments, a dielectric layer (not shown) may be further formed on the de-bonding layer 103. The dielectric layer may for example, be made of dielectric materials such as benzocyclobutene ("BCB"), polybenzoxazole ("PBO"), or any other suitable polymer-based dielectric material. In some embodiments, the dielectric layer may be omitted.

As illustrated in FIG. 1A, a redistribution layer 105 is formed on the carrier 101 and over the de-bonding layer 103. The redistribution layer 105 has a first surface S1 and a second surface S2 opposite to the first surface S1. The redistribution layer 105 is formed such that the second surface S2 faces the de-bonding layer 103, whereas the first surface S1 faces away from the de-bonding layer 103. In some embodiments, the redistribution layer 105 includes a plurality of dielectric layers 105A and a plurality of conductive layers 105B stacked alternately. In certain embodiments, the dielectric layers 105A may be made of non-organic or organic dielectric materials such as silicon oxide, silicon nitride, silicon carbide, silicon oxynitride, polyimide, benzocyclobutene (BCB), or the like. The conductive layers 105B may be made of copper, aluminum, nickel, or other suitable conductive materials. However, the materials of the dielectric layers 105A and the conductive layers 105B are not limited thereto, and this may be adjusted based on product requirement.

Figure 1B:
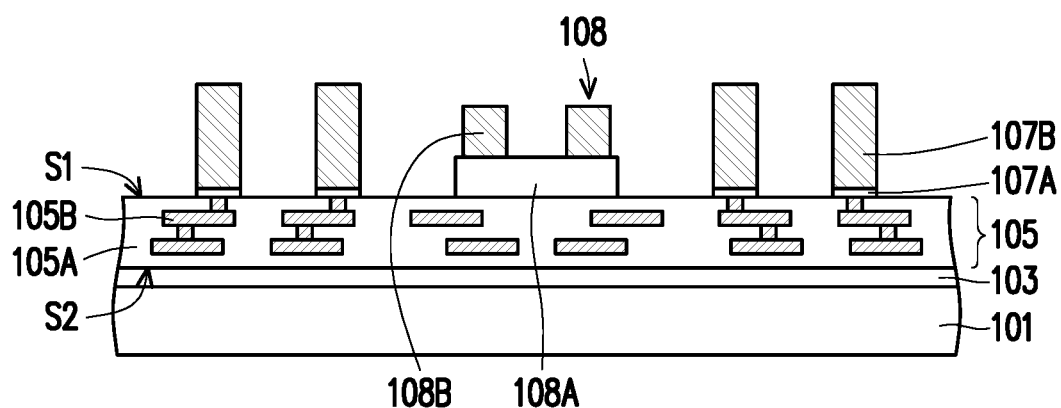

Referring to FIG. 1B, a bridge structure 108 is disposed on the first surface S1 of the redistribution layer 105. The bridge structure 108 may for example, includes a silicon bridge 108A and a plurality of conductive posts 108B connected to the silicon bridge 108A. In some embodiments, the bridge structure 108 is disposed on the redistribution layer 105 through a die attach film (not shown). In some embodiments, the bridge structure 108 may be used for providing short inter-connection between semiconductor dies that is provided thereafter.

Furthermore, as illustrated in FIG. 1B, a plurality of through insulator vias 107B is formed and surrounds the bridge structure 108. In some embodiments, the through insulator vias 107B are through integrated fan-out ("InFO") vias. In some embodiments, the formation of the through insulator vias 107B includes forming a mask pattern (not shown) with openings, then forming a metallic material (not shown) filling up the openings by electroplating or deposition, and removing the mask pattern to form the through insulator vias 107B on the redistribution layer 105. In certain embodiments, a seed layer 107A may be formed before forming the mask pattern and filling the metallic material, and the seed layer 107A is located between the bottoms of the through insulator vias 107B and the redistribution layer 105. The material of the seed layer 107A varies depending on the material of the later-formed through insulator vias 107B. In some embodiments, the material of the through insulator vias 107B may include copper or copper alloys. In certain embodiments, the through insulator vias 107B are copper pillars. In some embodiments, since the redistribution layer 105 is formed before the formation of the through insulator vias 107B, the seed layer 107A is formed on the redistribution layer 105 and between the bottoms of the through insulator vias 107B and the redistribution layer 105.

In the exemplary embodiment, the bridge structure 108 placed on the redistribution layer 105 may be arranged in an array, and when the bridge structure 108 are arranged in an array, the through insulator vias 107B may be classified into groups. The number of the bridge structure 108 may correspond to the number of groups of the through insulator vias 107B. In some embodiments, one or more of the bridge structure 108 may be placed on the redistribution layer 105 after the formation of the through insulator vias 107B. However, the disclosure is not limited thereto. In some alternative embodiments, one or more of the bridge structure 108 may be placed on the redistribution layer 105 before the formation of the through insulator vias 107B.

Figure 1C:
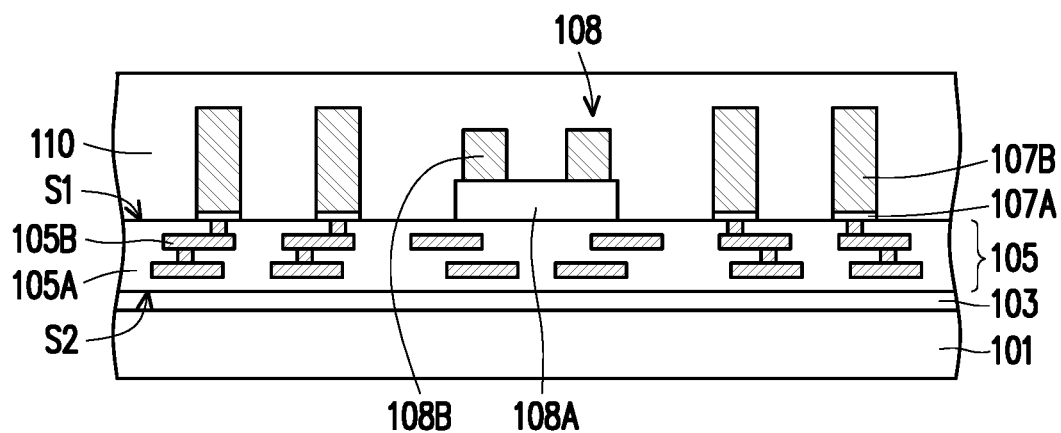

Referring to FIG. 1C, in a subsequent step, an insulating material 110 is formed on the first surface S1 of the redistribution layer 105 to encapsulate the bridge structure 108, the through insulator vias 107B and the seed layer 107A. In some embodiments, the insulating material 110 is formed through, for example, a compression molding process, filling up the gaps between the bridge structure 108 and adjacent through insulator vias 107B. In certain embodiments, no underfill exist in the gaps between the bridge structure 108 and adjacent through insulator vias 107B. At this stage, the conductive posts 108B of the bridge structure 108 and the through insulator vias 107B are encapsulated and well protected by the insulating material 110. In other words, the conductive posts 108B and the through insulator vias 107B are not revealed from the insulating material 110. In some embodiments, the insulating material 110 includes epoxy resins or other suitable resins.

Figure 1D:
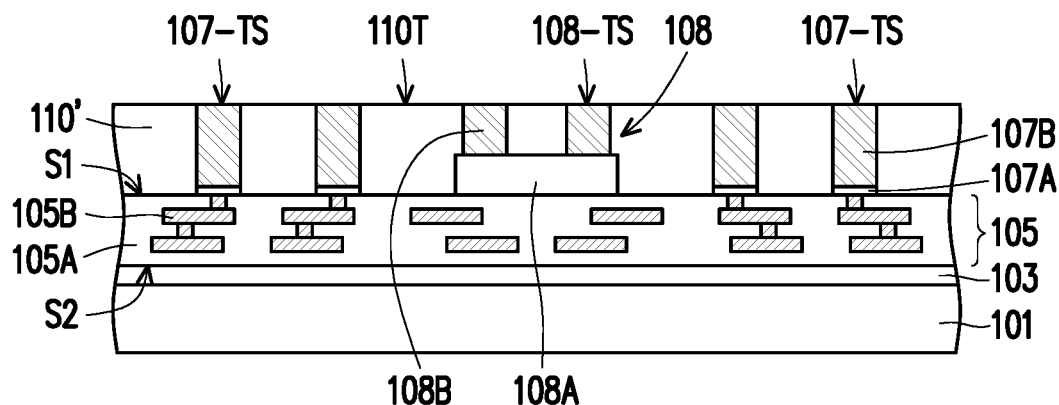

Referring to FIG. 1D, a thinning step is performed to form an insulating encapsulant 110'. In the exemplary embodiment, the thickness of the insulating material 110 is reduced until portions (107-TS) of the through insulator vias 107B and portions (108-TS) of the bridge structure 108 are revealed. In certain embodiments, the insulating material 110 is ground or polished by a mechanical grinding process and/or a chemical mechanical polishing (CMP) process until the top surfaces 108-TS of the conductive posts 108B are revealed. In some embodiments, the through insulator vias 107B may be partially polished so that the top surfaces 107-TS of the through insulator vias 107B are levelled with the top surfaces 108-TS of the conductive posts 108B. The insulating material 110 is polished to form an insulating encapsulant 110'. In some embodiments, the top surfaces (110T/108-TS/107-TS) of the insulating encapsulant 110', the conductive posts 108B and the through insulator vias 107B are coplanar and levelled with one another.

Figure 1E:
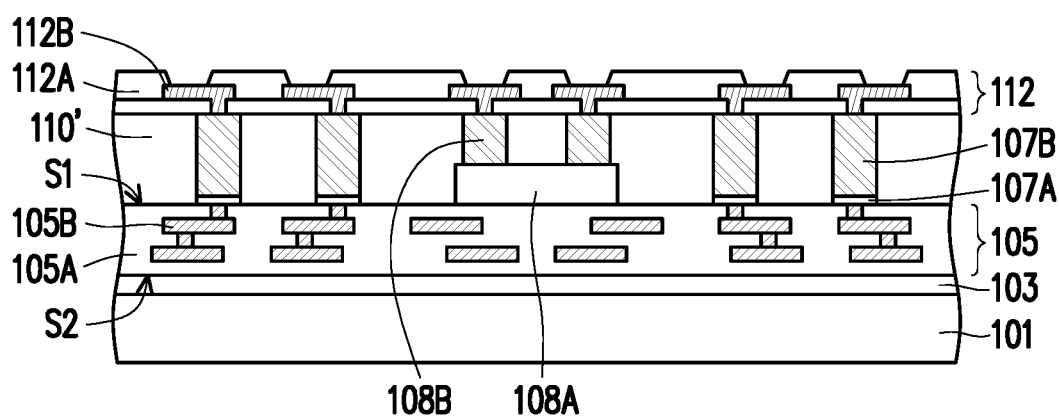

Referring to FIG. 1E, after the thinning process, a second redistribution layer 112 is formed on the insulating encapsulant 110'. The second redistribution layer 112 includes a plurality of dielectric layers 112A and a conductive layer 112B stacked alternately. Although only two dielectric layers 112A and one conductive layer 112B is illustrated, it should be noted that the disclosure is not limited thereto. In alternative embodiments, the number of dielectric layers 112A and conductive layers 112B may be adjusted based on product requirement. In some embodiments, the second redistribution layer 112 is electrically connected to the bridge structure 108, and electrically connected to the through insulator vias 107B by the conductive layer 112B. Furthermore, the uppermost dielectric layer 112A of the second redistribution layer 112 has openings that reveal the conductive layer 112B, which allows for further connection.

Figure 1F:
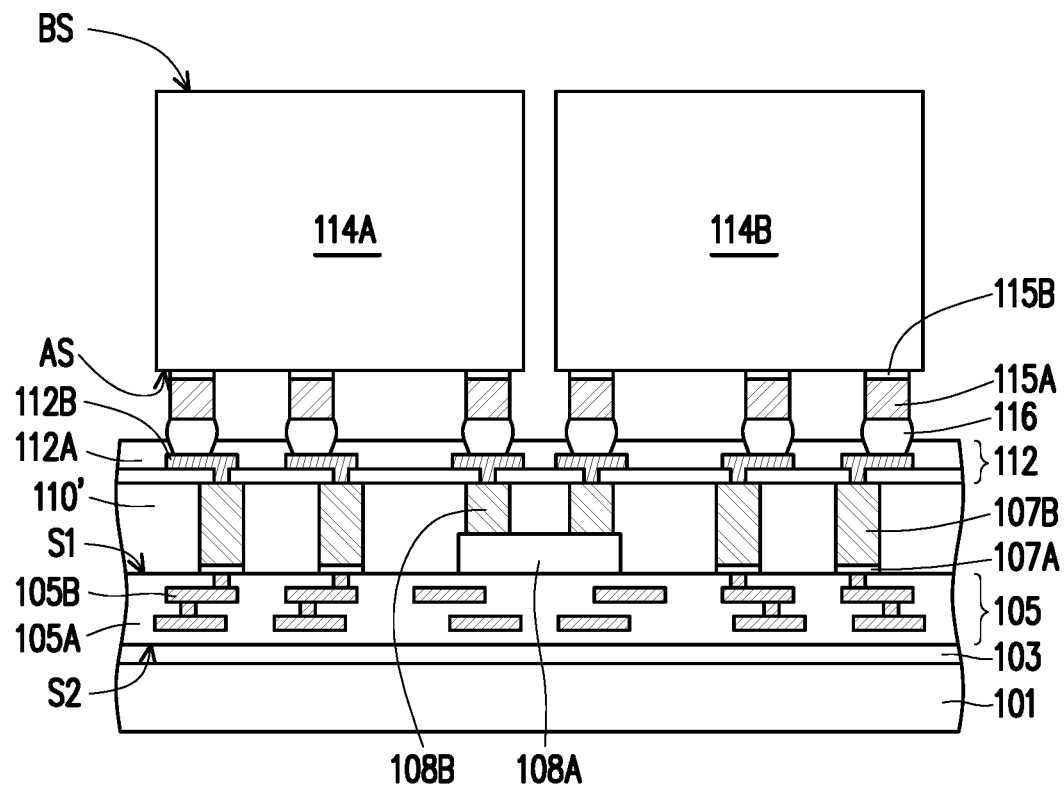

Referring to FIG. 1F, after forming the second redistribution layer 112, a first semiconductor die 114A and a second semiconductor die 114B are disposed onto the second redistribution layer 112 and a reflow process is performed to bond the first semiconductor die 114A and the second semiconductor die 114B to the second redistribution layer 112. In the exemplary embodiment, each of the first semiconductor die 114A and the second semiconductor die 114B includes a semiconductor substrate. The semiconductor substrate may be a bulk silicon substrate or a silicon-on-insulator (SOI) substrate, and further includes active components (e.g., transistors or the like) and optionally passive components (e.g., resistors, capacitors, inductors or the like) formed therein. Furthermore, each of the first semiconductor die 114A and the second semiconductor die 114B has an active surface AS and a backside surface BS opposite to the active surface AS. As shown in FIG. 1F, a plurality of conductive pillars 115A and a plurality of seed layers 115B are located on the active surface AS of the first semiconductor die 114A and the second semiconductor die 114B. The seed layer 115B is for example, located in between the conductive pillars 115A and the semiconductor substrate (of 114A/114B). In some embodiments, the formation of the conductive pillars 115A and the seed layers 115B includes forming a mask pattern (not shown) with openings, forming the seed layer in the opening, then forming a metallic material (not shown) filling up the openings by electroplating or deposition, and removing the mask pattern to form the conductive pillars 115A and the seed layers 115B. In addition, a plurality of conductive bumps 116 may be formed on the plurality of conductive pillars 115A for bonding and connection. In some embodiments, the seed layers 115B, the conductive pillars 115A and the conductive bumps 116 are pre-formed on the first semiconductor die 114A and the second semiconductor die 114B. In alternative embodiments, the conductive bumps 116 are formed on the conductive layer 112B of the second redistribution layer 112.

As shown in FIG. 1F, the conductive bumps 116 on the active surface AS of the first semiconductor die 114A and the second semiconductor die 114B faces the second redistribution layer 112 during bonding. In other words, the first semiconductor die 114A and the second semiconductor die 114B may be disposed on the second redistribution layer 112 in a face-down manner. In some embodiments, the first semiconductor die 114A and the second semiconductor die 114B are electrically connected to the second redistribution layer 112 through flip-chip bonding. In certain embodiments, the conductive bumps 116 are electrically connected to the conductive layer 112B that is exposed by the openings of the dielectric layer 112A after the reflow process. In some embodiments, the material of the conductive pillars 115A may include copper, nickel, or other types of conductive materials. In some embodiments, the conductive bumps 116 may include tin-silver bumps, or other types of conductive bump materials.

Figure 1G:
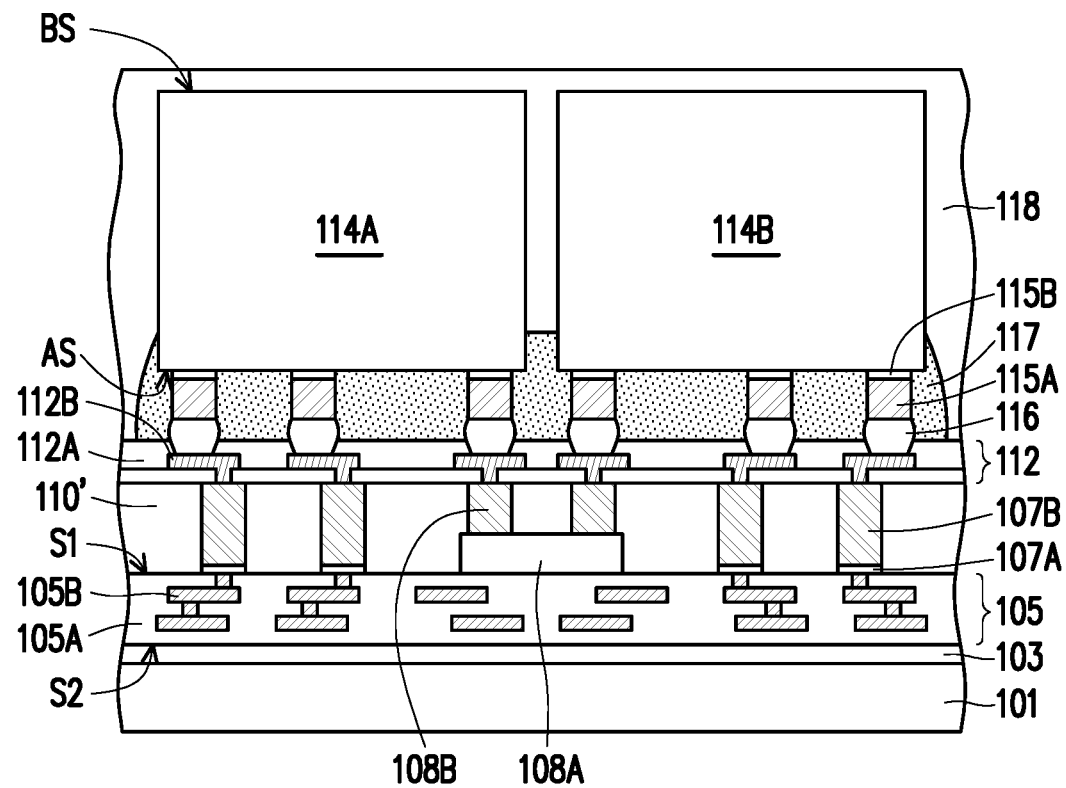

Referring to FIG. 1G, in a next step, an underfill structure 117 may be optionally formed to fill the spaces in between the first semiconductor die 114A, the second semiconductor die 114B and the second redistribution layer 112. For example, the underfill structure 117 fills the spaces in between adjacent conductive pillars 115A and conductive bumps 116 of the first semiconductor die 114A and the second semiconductor die 114B. In some embodiments, the underfill structure 117 further covers the sidewalls of the conductive pillars 115A and the seed layer 115B. The underfill structure 117 may help protect the conductive pillars 115A and conductive bumps 116 against thermal or physical stresses. In the exemplary embodiment, the underfill structure 117 is made of polymeric materials or resin materials, and a heating step is performed to cure the polymeric/resin material to form the underfill structure 117. However, in some other embodiments, the underfill structure 117 may be omitted, and the conductive bumps 116 may be bonded onto the second redistribution layer 112 without the underfill structure 117.

Subsequently, a molding compound 118 may be formed to at least encapsulate the first semiconductor die 114A and the second semiconductor die 114B. In some embodiments, the molding compound 118 is formed to encapsulate the whole first semiconductor die 114A and the whole second semiconductor die 114B and cover the backside surfaces BS of the first semiconductor die 114A and the second semiconductor die 114B. In some embodiments, the molding compound 118 is over-molded so that the top surface of the molding compound 118 is higher than the backside surfaces BS of the first semiconductor die 114A and the second semiconductor die 114B. In certain embodiments, no further grinding is performed after forming the molding compound 118. In alternative embodiments, the molding compound 118 may be grinded to reveal the backside surfaces BS of the first semiconductor die 114A and the second semiconductor die 114B. Furthermore, a heat dissipation layer (not shown) may be optionally formed on the revealed backside surfaces BS. In some embodiments, the molding compound 118 is formed by a molding process, and for example, include polymers (such as epoxy resins, phenolic resins, silicon-containing resins, or other suitable resins), dielectric materials having low permittivity (Dk) and low loss tangent (Df) properties, or other suitable materials. In some embodiments, the molding compound 118 may further include inorganic filler or inorganic compound (e.g. silica, clay, and so on) which can be added therein to optimize coefficient of thermal expansion (CTE) of the molding compound 118. The disclosure is not limited thereto.

Figure 1H:
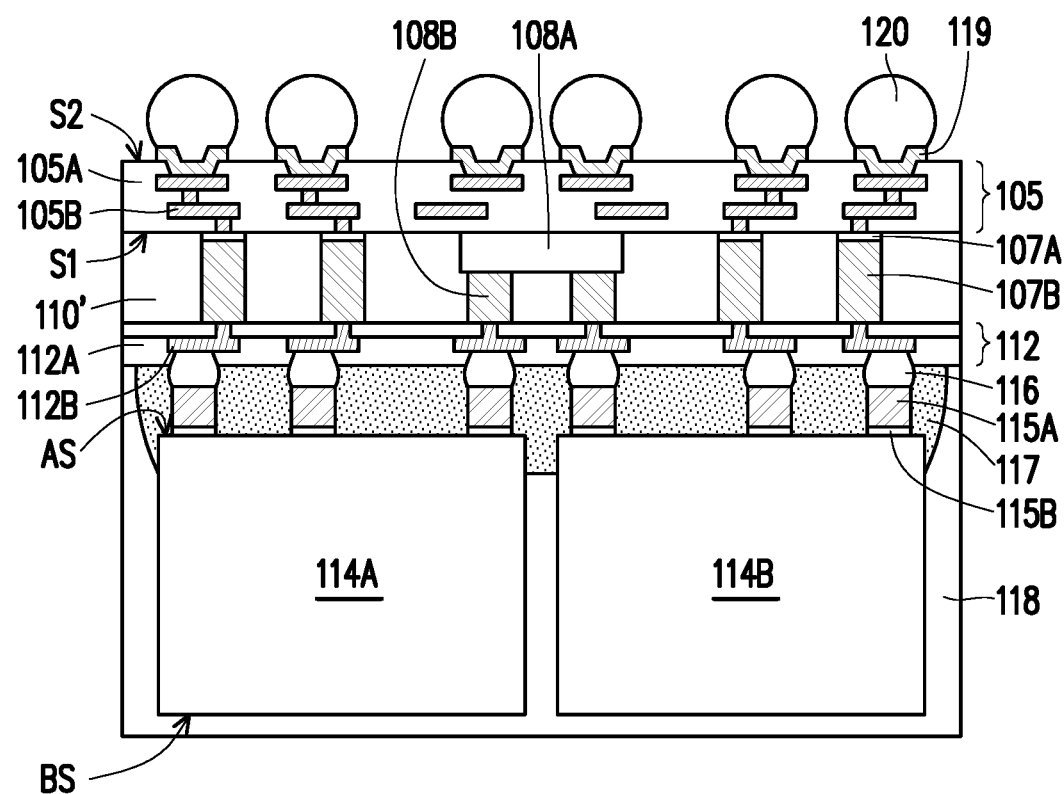

Referring to FIG. 1H, the structure shown in FIG. 1G is flipped (turned upside down) and attached to a tape (e.g., a dicing tape) so that the carrier 101 and the de-bonding layer 103 may be de-bonded from the redistribution layer 105. In some embodiments, the de-bonding layer 103 (e.g. LTHC release layer) is irradiated by UV laser such that the redistribution layer 105 can be separated from the carrier 101. Upon removal of the carrier 101 and the de-bonding layer 103, a second surface S2 of the redistribution layer 105 is revealed. In some embodiments, the second surface S2 of the redistribution layer 105 is patterned to form openings that reveal the conductive layer 105B, and a plurality of conductive pads 119 may be disposed within the openings. In some embodiments, the conductive pads 119 are for example, under-ball metallurgy (UBM) patterns used for ball mount. In certain embodiments, a plurality of conductive balls 120 is placed on the conductive pads 119 through a ball placement process. In certain embodiments, the conductive balls 120 are electrically connected to the through insulator vias 107B through the redistribution layer 105. Subsequently, a dicing process or singulation process may be performed to cut the whole wafer structure (cutting through the molding compound 118, the second redistribution layer 112, the insulating encapsulant 110' and the redistribution layer 105) into a plurality of packages. In the exemplary embodiment, the dicing process is a wafer dicing process including mechanical blade sawing or laser cutting. After the dicing process, individual package structure 10 is obtained.

In the completed structure shown in FIG. 1H, the package structure 10 comprises the first semiconductor die 114A and the second semiconductor die 114B encapsulated by the molding compound 118. The bridge structure 108 is disposed on the molding compound 118 and electrically connecting the first semiconductor die 114A to the second semiconductor die 114B. The plurality of through insulator vias 107B is surrounding the bridge structure 108 and electrically connected to any one of the first semiconductor die 114A or the second semiconductor die 114B. The seed layers 107A are disposed on the plurality of through insulator vias 107B and located in between the through insulator vias 107B and the redistribution layer 105. The insulating encapsulant 110' is encapsulating the bridge structure 108, the through insulator vias 107B and the seed layers 107A. The plurality of conductive bumps 116 is electrically connecting the first semiconductor die 114A and the second semiconductor die 114B to the bridge structure 108 and the plurality of through insulator vias 107B. The redistribution layer 105 is disposed on the insulating encapsulant 110' and over the bridge structure 108, wherein the redistribution layer 105 is electrically connected to the plurality of through insulator vias 107B and the plurality of seed layers 107A. In addition, the second redistribution layer 112 is disposed in between the molding compound 118 and the insulating encapsulant 110'.

Figure 2A:
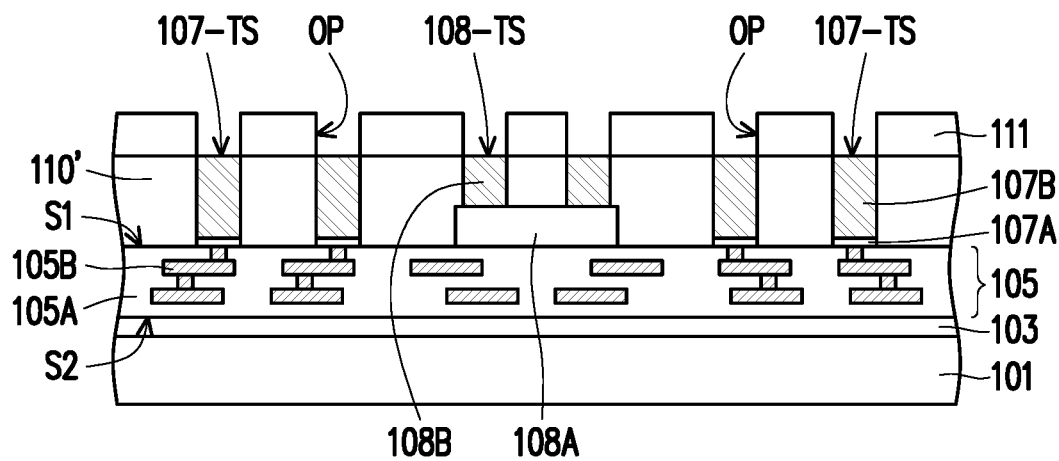
FIG. 2A to FIG. 2D are schematic sectional views of various stages in a method of fabricating a package structure according to some exemplary embodiments of the present disclosure.

FIG. 2A to FIG. 2D are schematic sectional views of various stages in a method of fabricating a package structure according to some exemplary embodiments of the present disclosure. The embodiment shown in FIG. 2A to FIG. 2D is similar to the embodiment shown in FIG. 1A to FIG. 1H, hence the same reference numerals are used to refer to the same or like parts, and some of its description will not be repeated herein. The difference between the embodiment shown in FIG. 2A to FIG. 2D and the embodiment shown in FIG. 1A to FIG. 1H is that the second redistribution layer 112 is omitted. As shown in FIG. 2A, after the thinning step shown in FIG. 1D, a dielectric layer 111 is formed on the surface of the insulating encapsulant 110'. That is, the dielectric layer 111 is formed on the insulating encapsulant prior to the bonding of the first semiconductor die 114A and the second semiconductor die 114B. Subsequently, the dielectric layer 111 is patterned to form a plurality of openings OP that expose the portions (top surface 107-TS) of the plurality of through insulator vias 107B and the top surface 108-TS of the bridge structure 108 (conductive posts 108B) for connection.

Figure 2B:
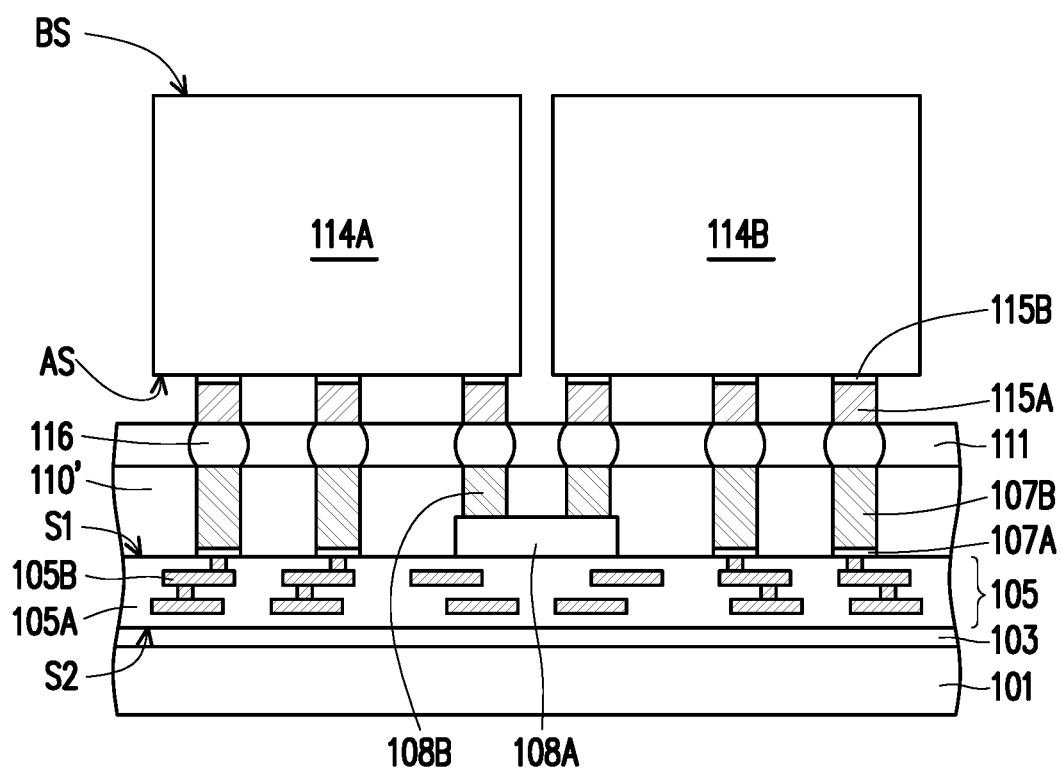

In the next step as shown in FIG. 2B, the first semiconductor die 114A and the second semiconductor die 114B having the conductive pillars 115A and the conductive bumps 116 are disposed over the insulating encapsulant 110' and fitted into the openings OP. In the illustrated embodiment, a reflow process is performed and the first semiconductor die 114A and the second semiconductor die 114B are attached and bonded to the plurality of through insulator vias 107B and the bridge structure 108 through the conductive bumps 116. The plurality of conductive bumps 116 is located within the plurality of openings OP and is electrically connected to the bridge structure 108 and the plurality of through insulator vias 107B. In other words, the plurality of conductive bumps 116 is in contact with the through insulator vias 107B, and in contact with the conductive posts 108B of the bridge structure 108 during bonding. Subsequently, referring to FIG. 2C, an underfill structure 117 may be optionally formed to fill the spaces in between the first semiconductor die 114A, the second semiconductor die 114B and the second redistribution layer 112. In some embodiments, a molding compound 118 may then be formed to encapsulate the first semiconductor die 114A and the second semiconductor die 114B, covering the backside surfaces BS of the first semiconductor die 114A and the second semiconductor die 114B. In some embodiments, the molding compound 118 is over-molded and is formed beyond the first semiconductor die 114A and the second semiconductor die 114B (i.e. the size or thickness the molding compound 118 is larger than the size or thickness of the first semiconductor die 114A, the whole second semiconductor die 114B).

Figure 2C:
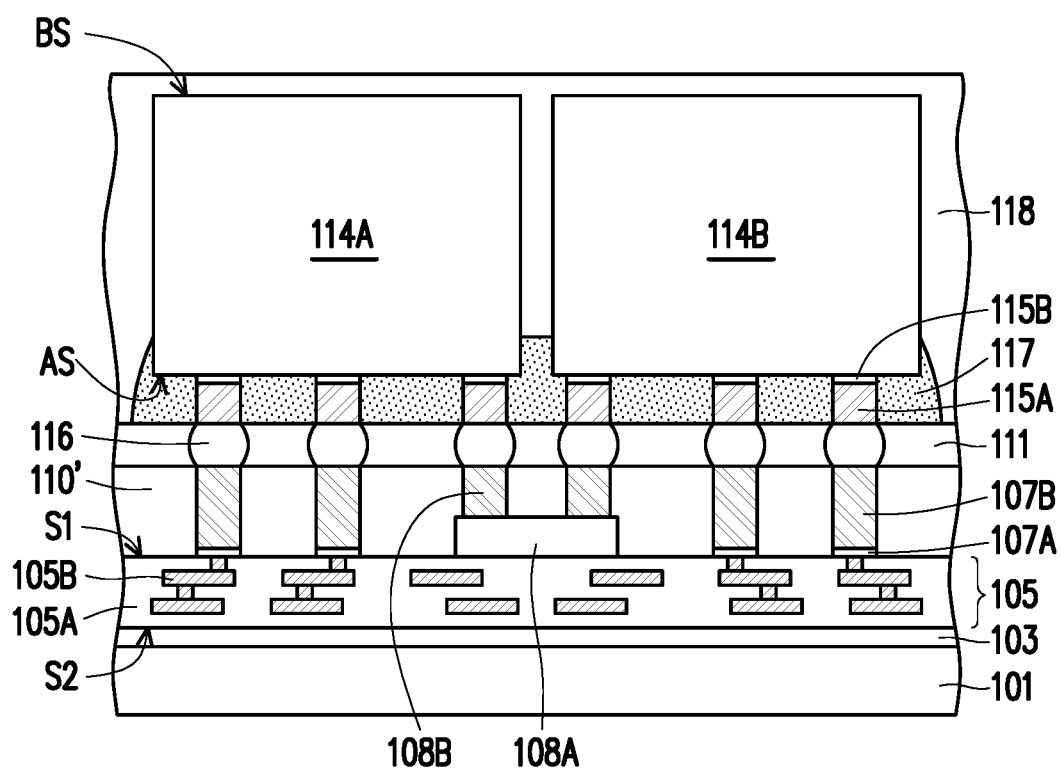
Figure 2D:
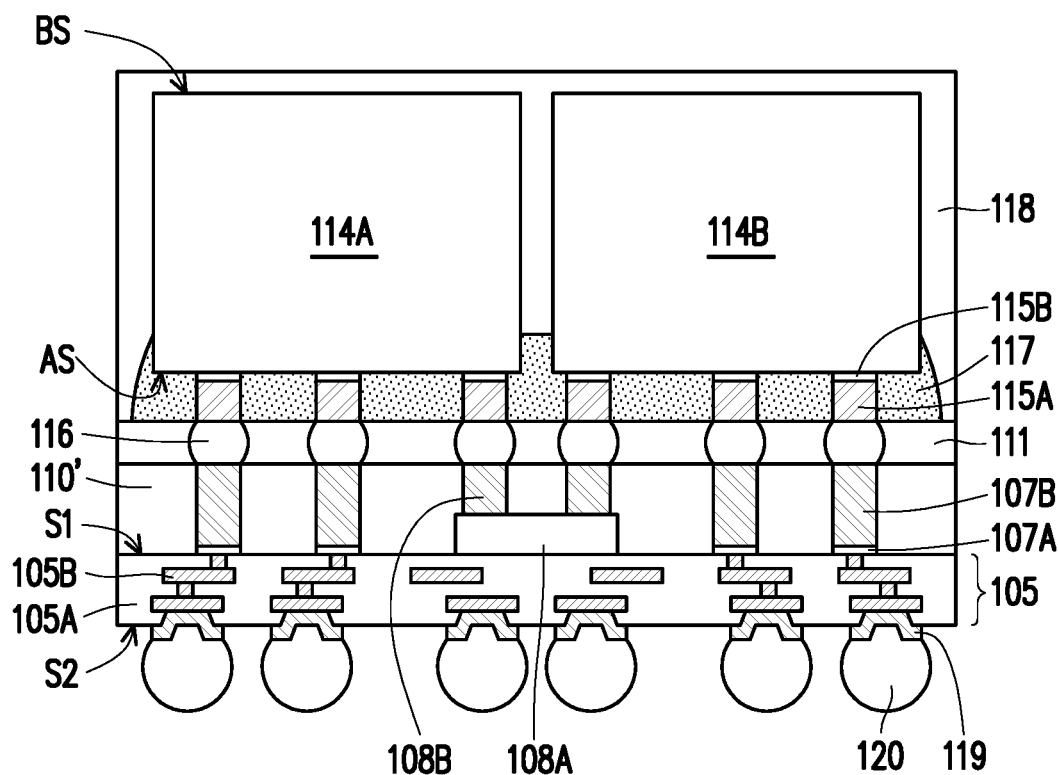

Referring to FIG. 2D, the structure shown in FIG. 2C may be flipped, and the carrier 101 and the de-bonding layer 103 may be de-bonded from the redistribution layer 105. Upon removal of the carrier 101 and the de-bonding layer 103, a second surface S2 of the redistribution layer 105 is revealed. In some embodiments, the second surface S2 of the redistribution layer 105 is patterned to form openings that reveal the conductive layer 105B. A plurality of conductive pads 119 may then be disposed within the openings, and a plurality of conductive balls 120 is placed on the conductive pads 119. In the next step, a dicing process or singulation process may be performed to cut the whole wafer structure (cutting through the molding compound 118, the second redistribution layer 112, the insulating encapsulant 110' and the redistribution layer 105) into a plurality of packages. After the dicing process, individual package structure 20 is obtained. In some embodiments, the obtained package structures 20 are turned upside down for further mounting or packaging. In the completed structure shown in FIG. 2D, the package structure 20 is similar to the package structure 10 shown in FIG. 1H. The difference being that the dielectric layer 111 is used in place of the second redistribution layer 112, and the conductive pillars 115A are connected to the through insulator vias 107B and the conductive posts 108B directly through the conductive bumps 116.

Figure 3:
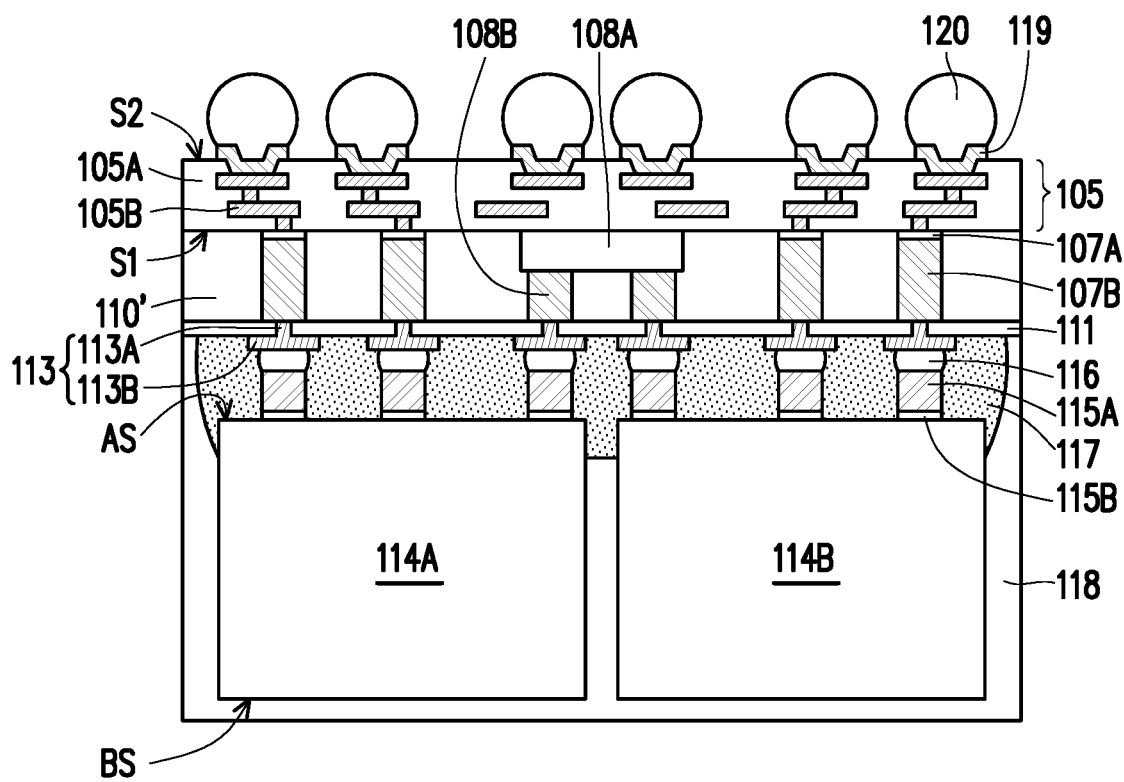
FIG. 3 is a sectional view of a package structure according to some exemplary embodiments of the present disclosure.

FIG. 3 is a sectional view of a package structure according to some exemplary embodiments of the present disclosure. The package structure 30 shown in FIG. 3 is similar to the package structure 20 shown in FIG. 2D, the difference being that a plurality of interconnection structures 113 is used for connecting the conductive bumps 116 to the through insulator vias 107B and the conductive posts 108B. Referring to FIG. 3, after forming the dielectric layer 111 and patterning the dielectric layer 111 to form openings (step shown in FIG. 2A), a plurality of interconnection structures 113 are formed within the openings to provide connection. In other words, the interconnection structures 113 electrically connect the bridge structure 108 and the plurality of through insulator vias 107B to the plurality of conductive bumps 116. In some embodiments, the interconnection structures 113 includes a connection line 113A and a connection pad 113B. The connection line 113A is filled within the opening of the dielectric layer 111, and is connected to the through insulator vias 107B or the conductive posts 108B. The connection pad 113B is disposed on the dielectric layer 111 and electrically connected to the connection line 113A, while the conductive bumps 116 are electrically connected to the through insulator vias 107B and the conductive posts 108B through the connection line 113A and connection pad 113B.

According to the above embodiments, a redistribution layer, a bridge structure and through insulator vias are formed/disposed on a carrier prior to the bonding of the semiconductor dies. Since the redistribution layer, the bridge structure and through insulator vias are formed first, the connection points for the conductive bumps may be readily controlled. As such, a misalignment issue of the semiconductor dies may be resolved, and the conductive bumps may be arranged with a fine pitch. Overall, a package structure with controllable wafer warpage and better electrical performance can be achieved. In addition, the described method requires less molding/grinding and photolithography processes as compared to the conventional method, hence a cost of fabricating the package structure may be reduced.

In accordance with some embodiments of the present disclosure, a package structure including a first semiconductor die, a second semiconductor die, a molding compound, a bridge structure, a plurality of through insulator vias, an insulating encapsulant, a plurality of conductive bumps, a redistribution layer, and a plurality of seed layers is provided. The molding compound is encapsulating the first semiconductor die and the second semiconductor die. The bridge structure is disposed on the molding compound and electrically connecting the first semiconductor die with the second semiconductor die. The plurality of through insulator vias is surrounding the bridge structure and electrically connected to the first semiconductor die or the second semiconductor die. The insulating encapsulant is encapsulating the bridge structure and the plurality of through insulator vias. The plurality of conductive bumps is electrically connecting the first semiconductor die and the second semiconductor die to the bridge structure and the plurality of through insulator vias. The redistribution layer is disposed on the insulating encapsulant and over the bridge structure, wherein the redistribution layer is electrically connected with the plurality of through insulator vias. The plurality of seed layers is disposed in between the plurality of through insulator vias and the redistribution layer.

In accordance with some other embodiments of the present disclosure, a method of fabricating a package structure is described. The method includes the following steps. A carrier is provided. A redistribution layer is formed on the carrier. A bridge structure and a plurality of through insulator vias is disposed and formed on the redistribution layer, wherein the plurality of through insulator vias surrounds the bridge structure. An insulating material is formed to encapsulate the bridge structure and the plurality of through insulator vias. A thinning step is performed to form an insulating encapsulant by reducing a thickness of the insulating material until portions of the plurality of through insulator vias and portions of the bridge structure are revealed. A first semiconductor die and a second semiconductor die is bonded to the plurality of through insulator vias and the bridge structure through a plurality of conductive bumps. A molding compound is formed to encapsulate the first semiconductor die and the second semiconductor die. The carrier is de-bonded and a plurality of conductive balls is formed on the redistribution layer.

In accordance with yet another embodiment of the present disclosure, a method of fabricating a package structure is described. The method includes the following steps. A carrier is provided. A redistribution layer is formed on the carrier, the redistribution layer has a first surface and a second surface opposite to the first surface. A bridge structure is disposed on the first surface of the redistribution layer. A plurality of seed layers is formed on the first surface of the redistribution layer and a plurality of through insulator vias is formed on the plurality of seed layers. An insulating encapsulant is formed on the first surface of the redistribution layer encapsulating the bridge structure, the plurality of through insulator vias and the seed layer. A first semiconductor die and a second semiconductor die is bonded to the plurality of through insulator vias and the bridge structure through a plurality of conductive bumps. A molding compound is formed to encapsulate the first semiconductor die and the second semiconductor die. The carrier is de-bonded to reveal the second surface of the redistribution layer. A plurality of conductive balls is formed on the second surface of the redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a package structure, comprising:
   providing a carrier;
   forming a redistribution layer on the carrier;
   disposing a bridge structure and forming a plurality of through insulator vias on the redistribution layer, wherein the plurality of through insulator vias surrounds the bridge structure;
   forming an insulating material encapsulating the bridge structure and the plurality of through insulator vias;
   performing a thinning step to form an insulating encapsulant by reducing a thickness of the insulating material until portions of the plurality of through insulator vias and portions of the bridge structure are revealed;
   forming a dielectric layer on the insulating encapsulant, and patterning the dielectric layer to form a plurality of openings that exposes the portions of the plurality of through insulator vias and conductive posts of the bridge structure for connection;
   bonding a first semiconductor die and a second semiconductor die to the plurality of through insulator vias and the bridge structure through a plurality of conductive bumps, wherein the bonding of the first semiconductor die and the second semiconductor die are performed after forming the dielectric layer, and the plurality of conductive bumps is physically joined with the plurality of through insulator vias and the bridge structure;
   forming a molding compound encapsulating the first semiconductor die and the second semiconductor die;
   de-bonding the carrier;
   forming a plurality of conductive balls on the redistribution layer; and
   performing a dicing process cutting through the molding compound, the insulating encapsulant and the redistribution layer, so that sidewalls of the molding compound, the insulating encapsulant and the redistribution layer are levelled.

2. The method according to claim 1, further comprising fitting the plurality of conductive bumps within the plurality of openings to be electrically connected to the bridge structure and the plurality of through insulator vias.

3. The method according to claim 1, wherein the first semiconductor die and the second semiconductor die each comprises a plurality conductive pillars, and the plurality of conductive pillars is electrically connected to the plurality of conductive bumps during bonding.

4. The method according to claim 3, further comprising forming an underfill structure after bonding the first semiconductor die and the second semiconductor die on the insulating encapsulant, wherein the underfill structure fills up the spaces in between each of the conductive pillars.

5. The method according to claim 1, wherein the molding compound is formed to cover backside surfaces of the first semiconductor die and the second semiconductor die.

6. The method according to claim 1, wherein the first semiconductor die has a first sidewall facing the second semiconductor die, the second semiconductor die has a second sidewall facing the first sidewall of the first semiconductor die, and the first semiconductor die and the second semiconductor die are bonded to the bridge structure in a way that the first sidewall and the second sidewall overlap with a silicon bridge of the bridge structure.

7. The method according to claim 1, wherein the bridge structure comprises a silicon bridge, and the plurality of conductive bumps is physically joined with the conductive posts of the bridge structure.

8. The method according to claim 1, further comprising grinding the molding compound to reveal backside surfaces of the first semiconductor die and the second semiconductor die, and forming a heat dissipation layer on the backside surfaces.

9. A method of fabricating a package structure, comprising:
   providing a carrier;
   forming a redistribution layer on the carrier, the redistribution layer has a first surface and a second surface opposite to the first surface;
   disposing a bridge structure on the first surface of the redistribution layer;
   forming a plurality of seed layers on the first surface of the redistribution layer and a plurality of through insulator vias on the plurality of seed layers;
   forming an insulating encapsulant on the first surface of the redistribution layer encapsulating the bridge structure, the plurality of through insulator vias and the seed layers;
   forming a dielectric layer on the insulating encapsulant, and patterning the dielectric layer to form a plurality of openings that exposes portions of the plurality of through insulator vias and conductive posts of the bridge structure for connection;
   bonding a first semiconductor die and a second semiconductor die to the plurality of through insulator vias and the bridge structure through a plurality of conductive bumps, wherein the bonding of the first semiconductor die and the second semiconductor die are performed after forming the dielectric layer, and the first semiconductor die and the second semiconductor die each comprises a plurality of conductive pillars that is physically joined with the plurality of conductive bumps, and the plurality of conductive bumps is physically joined with the plurality of through insulator vias and the bridge structure;

forming an underfill structure filling up the spaces in between each of the conductive pillars, wherein the underfill structure covers and is in physical contact with sidewalls of the plurality of conductive pillars;

forming a molding compound encapsulating the first semiconductor die and the second semiconductor die;

de-bonding the carrier to reveal the second surface of the redistribution layer; and forming a plurality of conductive balls on the second surface of the redistribution layer.

10. The method according to claim 9, wherein the plurality of conductive bumps is located within the plurality of openings to be electrically and physically connected to the bridge structure and the plurality of through insulator vias.

11. The method according to claim 9, wherein each of the first semiconductor die and the second semiconductor die further comprises a semiconductor substrate and a plurality of second seed layers located on the semiconductor substrate, wherein the plurality of second seed layers is sandwiched between the semiconductor substrate and the plurality of conductive pillars.

12. The method according to claim 9, wherein the bridge structure comprises a silicon bridge, and the plurality of conductive bumps is physically joined with the conductive posts of the bridge structure.

13. The method according to claim 9, wherein the molding compound is formed to cover backside surfaces of the first semiconductor die and the second semiconductor die.

14. A method of fabricating a package structure, comprising:

providing a carrier;

forming a redistribution layer on the carrier, wherein the redistribution layer has a first surface and a second surface opposite to the first surface;

disposing a bridge structure and forming a plurality of through insulator vias on the first surface of the redistribution layer, wherein the bridge structure comprises a silicon bridge and a plurality of conductive posts, and the plurality of through insulator vias surrounds the bridge structure;

forming an insulating encapsulant on the redistribution layer to encapsulate the bridge structure and the plurality of through insulator vias;

forming a dielectric layer on the insulating encapsulant, and patterning the dielectric layer to form a plurality of openings that exposes portions of the plurality of through insulator vias and portions of the plurality of conductive posts of the bridge structure for connection;

bonding a first semiconductor die and a second semiconductor die to the plurality of through insulator vias and the bridge structure through a plurality of conductive bumps, wherein the first semiconductor die and the second semiconductor die each comprises a plurality of conductive pillars that is physically joined with the plurality of conductive bumps, and the plurality of conductive bumps fills into the plurality of openings of the dielectric layer;

forming an underfill structure that simultaneously fills up the spaces in between each of the conductive pillars of the first semiconductor die and the second semiconductor die, and fills up the spaces sandwiched between sidewalls of the first semiconductor die and the second semiconductor die;

forming a molding compound encapsulating the first semiconductor die and the second semiconductor die;

de-bonding the carrier to reveal the second surface of the redistribution layer;

forming a plurality of conductive balls on the second surface of the redistribution layer; and performing a dicing process cutting through the molding compound, the insulating encapsulant and the redistribution layer, so that sidewalls of the molding compound, the insulating encapsulant and the redistribution layer are levelled.

15. The method of fabricating the package structure according to claim 14, wherein the plurality of conductive bumps is physically bonded to the plurality of conductive posts of the bridge structure or physically bonded to the plurality of through insulator vias.

16. The method of fabricating the package structure according to claim 14, further comprises forming a plurality of seed layers on the first surface of the redistribution layer, and forming the plurality of through insulator vias on the plurality of seed layers.

17. The method of fabricating the package structure according to claim 14, wherein the molding compound is formed to cover backside surfaces of the first semiconductor die and the second semiconductor die.

18. The method of fabricating the package structure according to claim 14, wherein the first semiconductor die has the sidewall facing the second semiconductor die, the second semiconductor die has the sidewall facing the sidewall of the first semiconductor die, and the first semiconductor die and the second semiconductor die are bonded to the bridge structure in a way that the sidewalls overlap with the silicon bridge of the bridge structure.

19. The method of fabricating the package structure according to claim 14, wherein the first semiconductor die and the second semiconductor die each comprises a plurality of seed layers and the plurality of conductive pillars located on the plurality of seed layers.

20. The method of fabricating the package structure according to claim 19, wherein the underfill structure further fills up the spaces in between each of the seed layers, and partially covers the sidewalls of the first semiconductor die and the second semiconductor die.

* * * * *